United States Patent
Ohmi et al.

[11] Patent Number: 5,959,484
[45] Date of Patent: Sep. 28, 1999

[54] FEED BACK CIRCUIT

[75] Inventors: Tadahiro Ohmi, 1-17-301, Komegebukuro 2-chome Aoba-ku, Sendai-shi Miyagi-ken 980; Tadashi Shibata, 5-2, Nihondaira, Taihaku-ku, Sendai-shi Miyagi-ken 982-02; Hiroaki Terada, Osaka-fu; Koji Kotani, Miyagi-ken, all of Japan

[73] Assignees: Tadashi Shibata, Miyagi-ken, Japan; Tadahiro Ohmi, Miyagi-ken, Japan

[21] Appl. No.: 08/807,374

[22] Filed: Feb. 27, 1997

[30] Foreign Application Priority Data

Mar. 13, 1996 [JP] Japan ................................. 8-056590

[51] Int. Cl.⁶ .................................................. H03K 19/20
[52] U.S. Cl. ...................... 327/200; 327/217; 365/185.07
[58] Field of Search ...................... 327/361, 355, 327/199, 200, 208, 217; 326/34, 35; 395/21, 24, 27; 365/185.05, 185.07

[56] References Cited

U.S. PATENT DOCUMENTS

| 5,521,858 | 5/1996 | Shibata et al. | 326/35 |
| 5,587,668 | 12/1996 | Shibata et al. | 326/36 |
| 5,661,421 | 8/1997 | Ohmi et al. | 326/63 |

Primary Examiner—Tuan T. Lam
Attorney, Agent, or Firm—Randall J. Knuth

[57] ABSTRACT

A feedback circuit is provided which is capable of realizing handshake functions, flip flop functions, and other functions using a smaller number of elements and chip surface. The threshold circuit is provided with an electrode which is electrically floating and a plurality of input electrodes which are connected with the floating electrode via capacity elements, and the circuit has a mechanism for essentially determining the potential of the floating electrode by means of the potentials applied to the input electrodes, and the output of the circuit is determined by the potential of the floating gate; the output of the threshold circuit is connected to at least one of the plurality of input electrodes, either directly, or via at least one circuit of some type.

5 Claims, 9 Drawing Sheets

FEED BACK CIRCUIT

FIELD OF THE INVENTION

The present invention relates to a feed back circuit. In greater detail, the present invention relates to feedback circuit which conducts calculations using a threshold operation and a voltage addition function by means of capacity.

BACKGROUND TECHNOLOGY

In the field of semiconductor integrated circuits, increasing integration of circuits is continuing as a result of the miniaturization of the elements. As the elements are miniaturized, it is not merely the case that the operational speed of the elements increases, but also the number of elements which can be placed on a single chip increases, so that the functions per chip increase. Microprocessor LSI is a good example of this; in current leading edge microprocessors, the element dimensions are on the order of 0.5 microns, and the number of elements per chip can reach several million.

However, in concert with the miniaturization of the elements and the increase in integration, a number of problems have come to the force. For example, a new problem has developed related to how to lay out and form the wiring which is necessary to connect individual elements among these millions of elements. As a result of such problems, the current stage of development is such that the further integration of elements will be extremely difficult. Accordingly, little improvement in LSI chip functions is expected in the future.

On the other hand, with integration, the operational speed of the LSI has also increased. In microprocessors, those having operational clock frequencies of a few hundred MHz have become common. In the near future it is inevitable that demands for clock frequencies of 1 GHz or more will emerge. In this situation, clock skew has especially become a problem. The distribution of a GHz clock signal without a time lag through the entirety of a 1 cm$^2$ chip is a very difficult problem. In order to realize LSI having operational speeds of GHz or greater, it is necessary to abandon the clock signal central control system, to adopt self-timing mechanisms, and to conduct timing while carrying out handshakes between nearby blocks. Self-timing mechanisms have found applications in elastic pipelines in data drive type processors (S. Komori, H. Taketa, T. Tamura, F. Asai, T. Ohno, O. Tomisawa, T. Yamasaki, K. Shima, K. Asada, and Terada, "An Elastic Pipeline Mechanism by Self-Timed Circuits," IEEE J. Solid-State Circuits, Vol. 23, No. 1, pp. 111–117, 1988), and the like. A schematic diagram is shown in FIG. 9. In the figure, the circuit indicated by C is a control circuit which conducts handshakes by means of a Send signal and an Ack signal. This C (coincidence) circuit is a type of flip flop, and the circuit diagram and truth table thereof are shown in FIG. 10. When the sending signal and the ackin inversion signal both have a value of 1, the value of the sendout signal is set to 1, while when both of these have a value of 0, the sendout signal is set to 0, and in other cases, the immediately previous sendout signal is maintained.

The basics of the handshake circuit are shown by the C circuit of FIG. 10; however, in order to realize data transmission having higher reliability, higher speed, and higher throughput, the improved C circuit of FIG. 11 is proposed. The circuit comprises 2 flip flop circuits. This circuit realizes a complete handshake. That is to say, the circuit realizes the following functions: 1) the rise of a sendin signal from the previous stage, 2) the fall of an ackout inversion signal to the previous stage, and the rise of a sendout signal to the following stage, 3) the fall of a sendin signal from the previous stage, and 4) the rise of an ackout inversion signal to the previous stage, and furthermore, the fall of a sendout signal to the fall stage at any time by means of the stopping of an ackin inversion signal from the following stage. By means of this handshake circuit, self-timing data transmission becomes possible, and LSI operation at a speed of GHz or more becomes possible.

However, handshake circuits for self-timing executed using conventional technology require 20 transistors in the case of the original C circuit of FIG. 10, and 24 transistors for the improved C circuit of FIG. 11, so that the handshake circuitry becomes undesirably large. The handshake circuitry is excess circuitry having no connection with the fundamental calculation functions of the LSI, and is thus overhead; when conventional technology is employed, this overhead becomes undesirably large, and this limits the degree of integration and the functions of the LSI.

In order to realize ultra high speed, ultra high integration, and highly functional LSI, the present invention has as an object there of to realize a semiconductor integrated circuit having handshake functions by using a smaller number of elements and a smaller chip area. Furthermore, the present invention is not limited to handshake circuits; with respect to other semiconductor circuits using flip flop functions, it has as an object thereof to provide a feedback circuit which is capable of realizing such circuitry using a smaller number of elements and smaller chip area.

DISCLOSURE OF THE INVENTION

The feedback circuit of the present invention comprises a threshold circuit which is provided with an electrode which is made electrically floating, and a plurality of input electrodes which are connected with the floating electrode via capacity elements, which has a mechanism in which the potential of the floating electrode is substantially determined by the potential applied to the input electrodes, and in which the output is determined by the potential of the floating electrode, wherein the output of the threshold circuit is connected, either directly or via at least one circuit of some type, to at least one of the plurality of input electrodes.

FUNCTION

The present invention employs the principles of highly functional neuron MOS transistors and of the logical circuits which employ neuron MOS transistors (inventors: Tadashi Shibata, Tadahiro Ohmi, Japanese Patent Application, First Publication No. HEI 3-6679, and Japanese Patent Application, First Publication No. HEI 4-816971). The neuron MOS transistor is a highly functional element having functions similar to those of living neurons; it has a floating gate and a plurality of input coupling electrodes which are capacitively coupled with the floating gate, and a weighted average of the input signals of the plurality of input coupling electrodes is calculated based on the floating gate level, and on the basis of the results of this, the on/off state of the transistor is controlled. In contrast to conventional transistors, which were termed 3-terminal devices because the on/off state of the current flowing between 2 terminals was controlled by a third terminal, the neuron MOS transistor can be said to be a 4-terminal device in that it has a plurality of fourth terminals which are capable of controlling the method of control of the third terminal, which controls the on/off state of the current flowing between the other 2 terminals. Because the element itself is highly functional, if it is employed in a logical circuit, the number of elements and wires necessary to realize a certain logical function is drastically reduced in comparison with the case in which conventional CMOS logical circuits are employed. Furthermore, it is a simple matter to achieve the flexible signal processing which was difficult to achieve with circuits employing conventional transistors in which the on/off state was controlled by simply making a determination as to whether a single input had a value of 0 or 1, and it thus becomes possible to easily construct highly functional circuits such as flexible logic circuits, real time rule-variable matching circuits, winner take all circuits, associative memories and the like. In this way, the neuron MOS transistor can be said to be a novel device which has the possibility of making possible completely new circuit technologies which contribute to the realization of ultra high speed and ultra high function LSI. Since the basic elements themselves employ highly functional neuron MOS, it is possible to realize handshake circuits, which conventionally required a large number of elements and a large chip surface, using a smaller number of elements and a smaller chip surface. By means of this, ultra high speed operations of GHz or more can be realized in LSI by using an extremely small number of additional elements and chip surface. Furthermore, the present invention is not limited to applications as a handshake circuit; it can be broadly applied to common logical circuits employing flip flops, and makes it possible to reduce the number of elements and chip surface required for the realization of functions. By means of the foregoing, it is possible to realize ultra-high speed, ultra-large scale integration, and ultra high function LSI.

(Description of the References)

| | |
|---|---|
| 101 | P type neuron MOS transistor, |
| 102 | N type neuron MOS transistor, |
| 103 | floating gate, |
| 104, 105, 106 | input electrodes, |
| 107, 108 | CMOS inverters, |
| 301 | P type neuron MOS transistor, |
| 302 | N type neuron MOS transistor, |
| 303 | floating gate, |
| 304, 305, 306, 307 | input electrodes, |
| 308 | CMOS inverter, |
| 401 | P type neuron MOS transistor, |
| 402 | N type neuron MOS transistor, |
| 403 | floating gate, |
| 404, 405, 405, 406 | input electrodes, |
| 407 | NOR gate, |
| 501 | P type neuron MOS transistor, |
| 502 | N type neuron MOS transistor, |
| 503 | floating gate, |
| 504, 505, 506, 507, 508 | input electrodes, |
| 509 | P type neuron MOS transistor, |
| 510 | N type neuron MOS transistor, |
| 511 | floating gate of the second neuron MOS inverter, |
| 512, 513, 514, 515 | input electrodes, |
| 516, 517, 518 | CMOS invertors, |
| 601 | P type neuron MOS transistor, |
| 602 | N type neuron MOS transistor, |
| 603 | common floating gate, |
| 604, 605, 606 | input electrodes, |
| 607 | CMOS inverter, |
| 608 | N type MOS transistor. |

BEST MODE FOR CARRYING OUT THE INVENTION

Hereinbelow, the present invention will be explained in detail on the basis of embodiments; however, it is of course the case that the present invention is in no way limited to the embodiments described.

(Embodiment 1)

Figure 1:
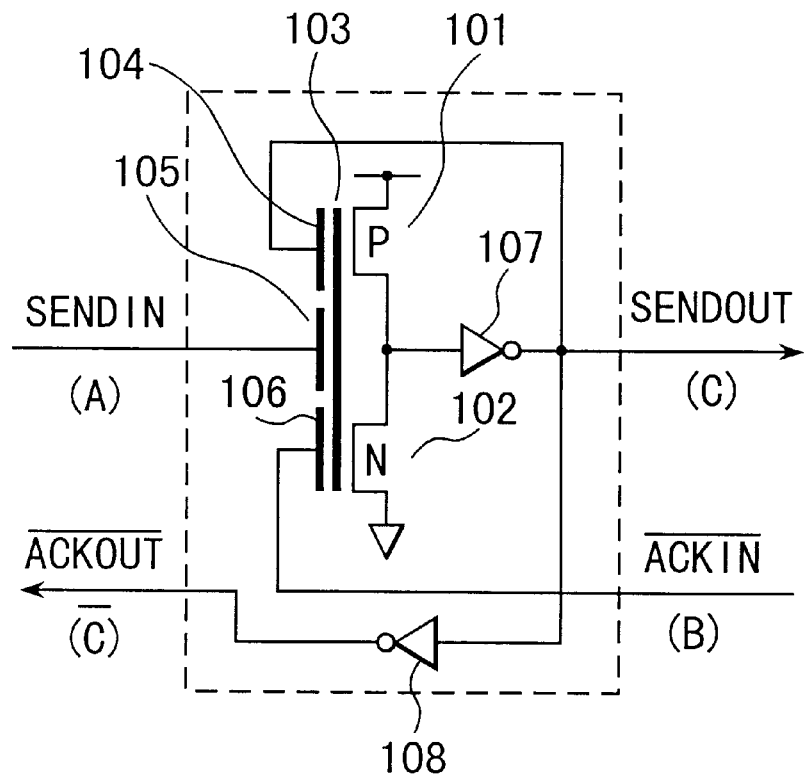
FIG. 1 is a circuit diagram showing a first embodiment.
Figure 10:
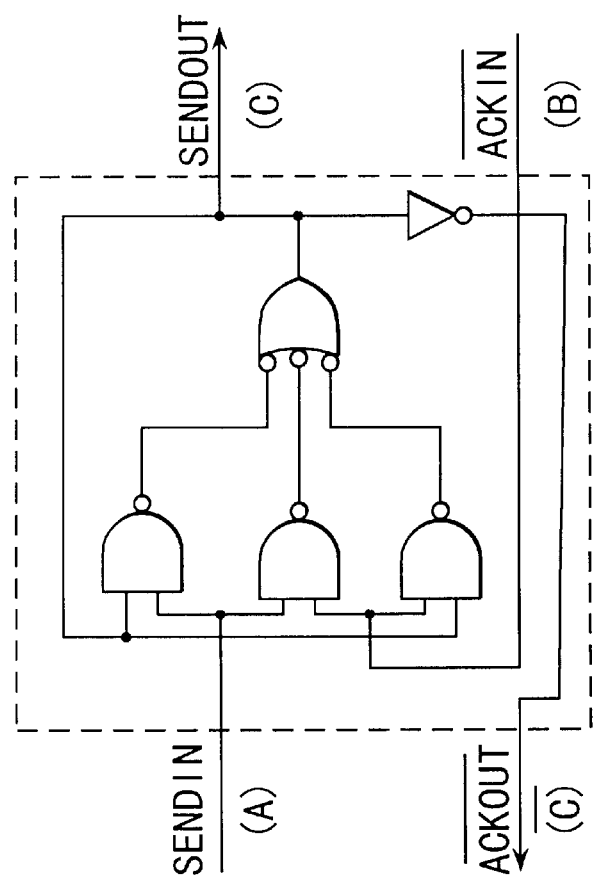
FIG. 10 is a C circuit diagram showing the fundamentals of the handshake circuit.

FIG. 1 is a structural diagram of a circuit showing a first embodiment of the present invention. This circuit has the same functions as the original C circuit shown in FIG. 10. In the figure, reference 101 indicates a P type neuron MOS transistor, reference 102 indicates a N type neuron MOS transistor, and this forms a neuron MOS inverter. Reference 103 indicates a floating gate which is common to neuron MOS transistors 101 and 102. References 104, 105, and 106 indicate 3 input electrodes having equal capacities which are coupled to floating gate 103. References 107 and 108 indicate standard CMOS inverters. The output of the neuron MOS inverter, which is a threshold element, is connected to the input electrode 104 of the neuron MOS inverter via the inverter 107. The inputs of this circuit are the sendin signal, which is connected to input electrode 105, and the ackin inversion signal, which is connected to input electrode 106. The outputs are the sendout signal, which is the output of inverter 107, and the ackout inversion signal, which represents an inversion of the sendout signal by inverter 108. The inversion threshold value of the neuron MOS inverter is set at $V_{DD}/2$. The potential of floating gate 103 has value which is the average of the potentials of input electrodes 104, 105, and 106, if the parasite effect is ignored. Now when the output of inverter 107 is 0, that is to say, when the sendout output signal has a value of 0, the potential of input electrode 104 is 0, so that so long as the potentials of input electrode 105 and input electrode 106 do not both have a value of $V_{DD}$, the potential of floating gate 103 will not exceed the inversion threshold value, $V_{DD}/2$, of the neuron MOS inverter. Accordingly, the sendout signal will remain at a value of 0. That is to say, the 0 state will be stored. However, when the potential of input electrode 105 and of input electrode 106 both have a value of $V_{DD}$, then the potential of floating gate 103 will have a value of $2V_{DD}/3$, the neuron MOS inverter will invert, and will output a value of 0. This is inverted by inverter 107, and the sendout signal will have a value of 1 (a potential of $V_{DD}$). Once the output of inverter 107 has reached a value of $V_{DD}$, the potential of input electrode 104 acquires a value of $V_{DD}$, and the floating gate 103 will rise by a value of $V_{DD}/3$. When this state is reached, so long as the sendin signal and the ackin inversion signal do not both have a value of 0, this state will be maintained. This function is completely identical to the function of the C circuit shown in FIG. 10. Accordingly, this can be seen to function as a handshake circuit as well. This circuit is realized using 2 neuron MOS transistors, 4 standard MOS transistors, and 3 capacity elements, for a total of 9 elements. In comparison with the conventional example of FIG. 10, which requires 20 elements, the same functions are realized in the present invention using less than half the number of elements.

Figure 2:
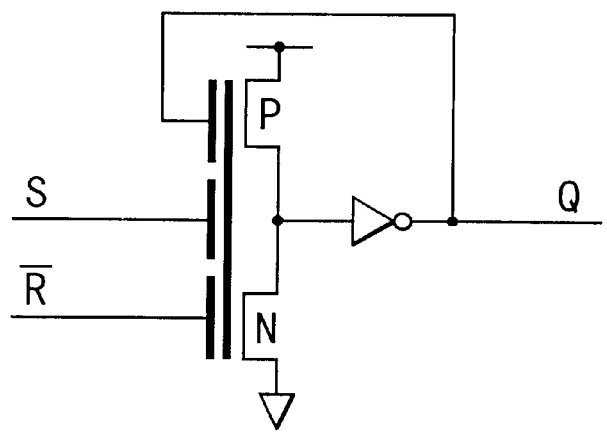
FIG. 2 is a circuit diagram in which the inverter of the circuit of FIG. 1 has been removed.

The circuit of FIG. 2 is a circuit in which the inverter 108 is removed from the C circuit of FIG. 1; this circuit functions as a RS flip flop. If the sendin and ackin inversion signals which are the inputs in FIG. 1 are taken as a set (S) signal and a reset (R) inversion signal, then when S and R inversion signal both have a value of 1, that is to say, when S=1 and R=0, then the output Q is set to a value of 1. When both S and the R inversion signal have a value of 0, that is to say, when S=0 and R=1, then the output Q is reset to a value of 0. When S has a value of 0, and the R inversion signal has a value of 1, that is to say, when S=0 and R=0, then the output Q maintains the immediately previous value. Furthermore, when S has a value of 1 and the R inversion signal has a value of 0, that is to say, when S=1 and R=1, the output Q maintains the immediately previous value. This function differs from a conventional RS flip flop, and this is the reason why this circuit is termed a C circuit. In this way, the circuit of the present invention can be understood as a type of flip flop, and a variety of applications for such a circuit can be imagined.

In the first embodiment described above, a neuron MOS inverter was employed as the threshold element employing neuron MOS; however, this need not be an inverter, and a circuit which outputs a value of 1 when a threshold value is exceeded, in the manner of a neuron element, may be employed. Furthermore, an inverter was employed as the circuit through which the output of the threshold element using neuron MOS was connected to an input gate of the same element; however, other circuits may be employed. Furthermore, the output of the threshold element may be directly connected to an input gate.

(Second Embodiment)

Figure 3:
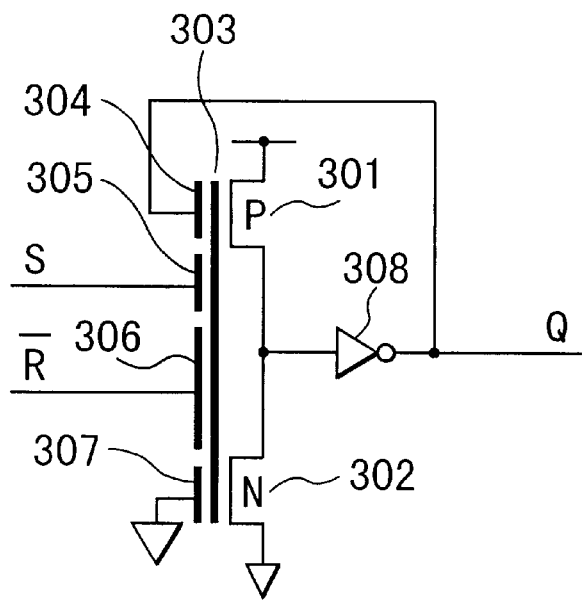
FIG. 3 is a circuit diagram showing a second embodiment.

FIG. 3 is a structural diagram of a circuit showing a second embodiment of the present invention. In the figure, reference 301 indicates a P type neuron MOS transistor, and reference 302 indicates a N type neuron MOS transistor; this forms a neuron MOS inverter. Reference 303 indicates a floating gate which is common to neuron MOS transistors 301 and 302. References 304, 305, 306, and 307 indicate 4 input electrodes which are coupled with the floating gate 303, the capacity ratio of which is set to 1:1:2:1. Reference 308 indicates a standard CMOS inverter. The output of the neuron MOS inverter, which is the threshold element, is connected to the input electrode 304 of the neuron MOS inverter itself via inverter 308. The inputs of this circuit are the S signal which is connected to the input electrode 305, and the R inversion signal, which is connected to the input electrode 306. The output is the Q signal, which is the output of inverter 308. Input electrode 307 is grounded. The threshold value of the neuron MOS inverter is set to a value of $V_{DD}/2$. The potential of floating gate 303 has a value which is the weighted average of the potentials of input electrodes 304, 305, 306, and 307, if the parasite effect is ignored. The coupling capacity of electrode 307 is two times that of the other electrodes, so that a two-fold weighting is applied even if this is averaged. Now, when the output of inverter 308 is 0, that is to say, when the Q signal has a value of 0, the potential of input electrode 304 is 0, so that so long as the potentials of input electrode 305 and input electrode 306 do not both have a value of $V_{DD}$, the potential of floating gate 303 will not exceed the inversion threshold value, $V_{DD}/2$, of the neuron MOS inverter. Accordingly, the Q signal will remain at a value of 0. That is to say, the 0 state will be stored. However, when the potentials of input electrode 305 and input electrode 306 both reach a value of $V_{DD}$, then the potential of floating gate 303 becomes $3 V_{DD}/5$, and the neuron MOS inverter inverts and outputs a value of 0. This is inverted by inverter 308, and the Q signal obtains a value of 1 (the potential is $V_{DD}$). When the output of inverter 308 reaches a value of $V_{DD}$, the potential of input electrode 304 reaches $V_{DD}$, and the potential of floating gate 303 is increased by $V_{DD}/5$. When this state is reached, so long as the R inversion signal does not acquire a value of 0, this state (Q=1) will be maintained. That is to say, even if only S reaches a value of 0, Q will maintain a value of 1; however, even if S=1, if the R inversion signal reaches a value of 0, the neuron MOS inverter will invert, and Q will be set equal to 0. This point is different from the operation of the circuit shown in FIG. 2. This is a reset priority RS flip flop function.

In the second embodiment described above, a neuron MOS inverter was employed as the threshold element using neuron MOS; however, this need not be an inverter, and a circuit which output a value of 1 when a threshold value is exceeded in the manner of a neuron element may be employed. Furthermore, an inverter was used as the circuit through which the output of the threshold element using neuron MOS was connected to the input gate of the element; however, other circuits may be employed. Furthermore, the output of the threshold element may be directly connected to the input gate.

(Third Embodiment)

Figure 4:
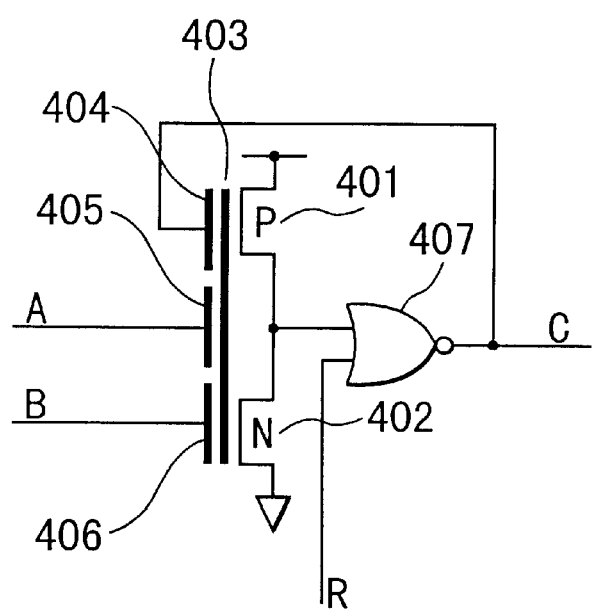
FIG. 4 is a circuit diagram showing a third embodiment.

FIG. 4 is a structural diagram of a circuit showing a third embodiment of the present invention. In the figure, reference 401 indicates a P type neuron MOS transistor, and reference 402 indicates a N type neuron MOS transistor; this forms a neuron MOS inverter. Reference 403 indicates a floating gate which is common to neuron MOS transistors 401 and 402. References 404, 405, and 406 indicate 3 input electrodes having equal capacities which are coupled with floating gate 403. Reference 407 indicates a NOR gate. The output of the neuron MOS inverter, which is a threshold element, is connected to the input electrode 404 of the neuron MOS inverter itself via NOR gate 407. NOR gate 407 is employed in place of the inverter in FIGS. 1 and 2; fundamentally, this circuit is the same as the C circuit which is shown in FIGS. 1 and 2. One input of NOR gate 407 is employed as a reset signal R. By using the NOR gate, it is possible to control the potential of the input electrode 404 irrespective of the output of the neuron MOS inverter. Now, when the reset signal R has a value of 1, the output of NOR gate 407, that is to say, the potential of input gate 404, is set to a value of 0 irrespective of the output of the neuron MOS inverter. Accordingly, when the reset signal R has reached a value of 1, the output C has a value of 0, except in the case in which both outputs A and B have a value of 1. This is the reset operation. That is to say, by using a NOR gate in place of the inverter, it is possible to construct a C circuit with a reset input.

In the third embodiment described above, a neuron MOS inverter was employed as the threshold element using neuron MOS; however, this need not be an inverter, and a circuit which outputs a value of 1 when a threshold value is exceeded, in the manner of a neuron element, may be employed. Furthermore, an NOR gate was employed as the circuit through which the output of the threshold element using neuron MOS was connected to the input gate of the element; however, other circuits may be employed, and a variety of circuits may be realized, such as, for example, the realization of a modified reset priority RS flip flop using a NAND gate and the like. Furthermore, the output of the threshold element may be directly connected to the input gate.

(Fourth Embodiment)

Figure 5:
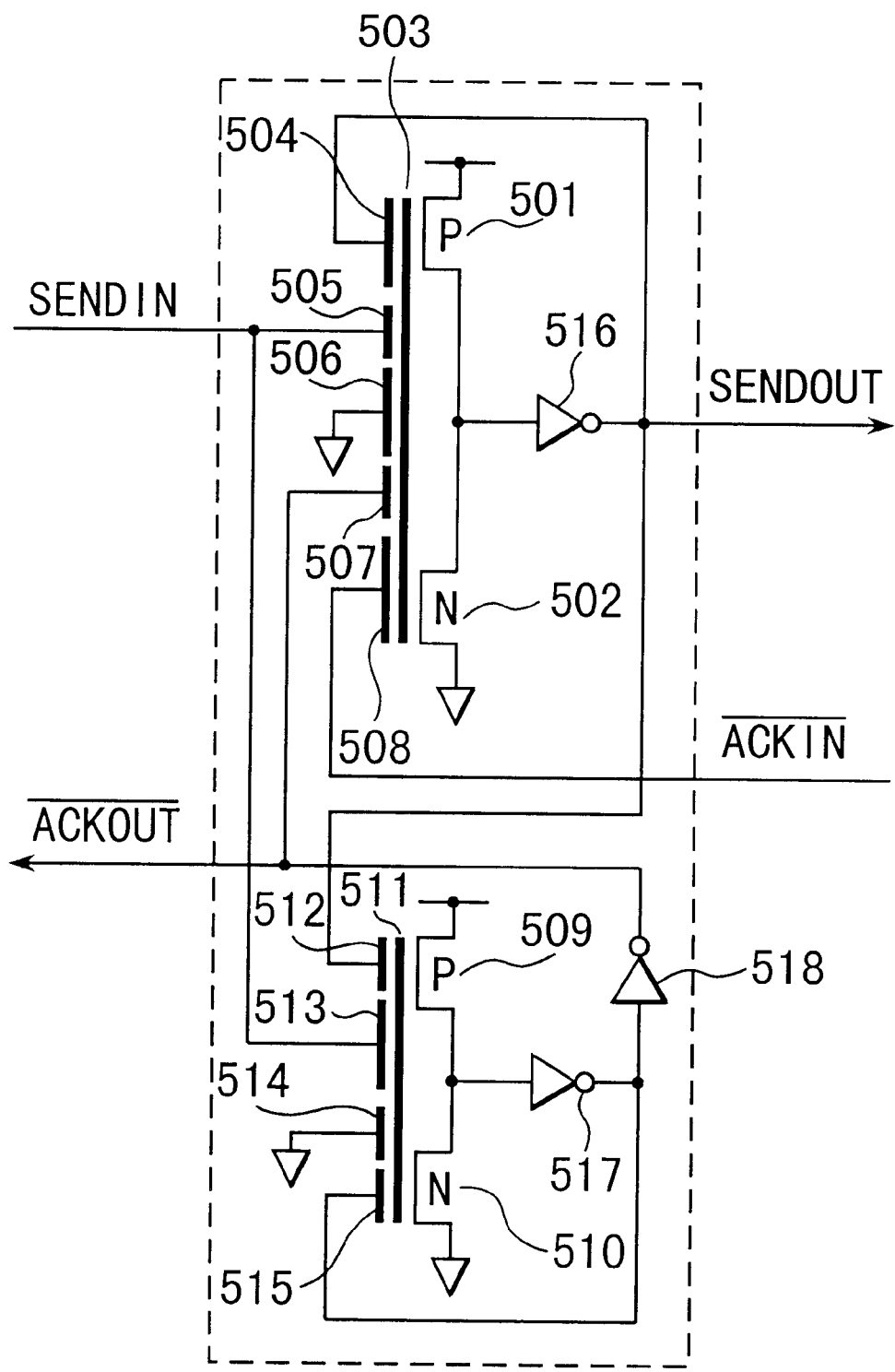
FIG. 5 is a circuit diagram showing a fourth embodiment.

FIG. 5 is a structural diagram of a circuit showing a fourth embodiment of the present invention. This circuit has functions identical to those of the modified C circuit shown in FIG. 11. In the figure, reference 501 indicates a P type neuron MOS transistor, and reference 502 indicates a N type neuron MOS transistor; this forms a first neuron MOS inverter. Reference 503 indicates a floating gate which is common to neuron MOS transistors 501 and 502. References 504, 505, 506, 507, and 508 indicate 5 input electrodes coupled with floating gate 503, which have a capacity ratio of 2:1:2:1:3. Reference 509 indicates a P type neuron MOS transistor, and reference 510 indicates a N type neuron MOS transistor; this forms a second MOS inverter. Reference 511 indicates the floating gate of the second neuron MOS inverter comprising the neuron MOS transistors 509 and 510. References 512, 513, 514, and 515 indicate four input electrodes which are coupled with floating gate 511 and which have a capacity ratio of 1:2:1:1. References 516, 517, and 518 indicate standard CMOS inverters. The output of the first neuron MOS inverter is connected to the input electrode 504 of the first neuron MOS inverter itself, and to the input electrode 512 of the second neuron MOS inverter, via inverter 516. The output of the second neuron MOS inverter is connected to the input electrode 515 of the second neuron MOS inverter itself via inverter 517, and is connected to the input electrode 507 of the first neuron MOS inverter via inverters 517 and 518. The input electrode 506 of the first neuron MOS inverter, and the input electrode 514 of the second neuron MOS inverter, are grounded. The inversion threshold value of the first and second neuron MOS inverters is $V_{DD}/2$. The input of these circuits are the sendin signals connected to input electrodes 505 and 513, and the ackin inversion signal connected to input electrode 508. The outputs are the sendout signal which is the output of inverter 516, and the ackout inversion signal which is the output of inverter 518.

The operation will now be explained. The case will be considered in which the sendin signal has a value of 0, the ackin inversion signal has a value of 1, the sendout signal has a value of 0, and the ackout inversion signal has a value of 1. At this time, the potential of the floating gate 503 of the first neuron MOS inverter is $4 V_{DD}/9$, and the potential of the floating gate 511 of the second neuron MOS inverter is 0, and the circuit stably maintains this state. When the sendin signal attains a value of 1 (the potential is $V_{DD}$), then with respect to the first neuron MOS inverter, the potential of the floating gate 503 becomes $5 V_{DD}/9$, the inversion threshold value is exceeded, and this inverts. The sendout signal which is the output of inverter 516 reaches a value of 1. Since the potential of the input electrode 504 reaches $V_{DD}$, the potential of floating gate 503 finally becomes $7 V_{DD}/9$. With respect to the second neuron MOS inverter, the potential of floating gate 511 becomes $2 V_{DD}/5$, since the potential of input electrode 513 has first become $V_{DD}$. Continuing, the first neuron MOS inverts, and the potential of input electrode 512 becomes $V_{DD}$, so that the potential of floating gate 511 becomes $3 V_{DD}/5$, the inversion threshold value is exceeded, and the second neuron MOS inverter inverts. The potential of input electrode 515, which forms the output of inverter 517, becomes $V_{DD}$, so that the potential of floating gate 511 finally becomes $4 V_{DD}/5$. The ackout inversion signal reaches a value of 0. At this time, the potential of input electrode 507 of the first neuron MOS inverter also reaches a value of 0, and as a result the potential of the floating gate 503 of the first neuron MOS inverter reaches a value of $6 V_{DD}/9$; however the inversion threshold value was previously exceeded, so that the state of the first neuron MOS inverter does not change, and the sendout signal retains a value of 1.

In the next step, in the case in which the ackin inversion signal falls prior to the fall of the sendin signal, with respect to the first neuron MOS inverter, the potential of the floating gate 503 becomes $3 V_{DD}/9$, and this is below the inversion threshold value, so that the inverter resets. The sendout signal, which is the output of inverter 516, reaches a value of 0. Because the potential of input electrode 504 is 0, the potential of floating gate 503 ultimately becomes $V_{DD}/9$. With respect to the second neuron MOS inverter, the potential of floating gate 511 becomes $3 V_{DD}/5$, since the first neuron MOS inverts, and the input electrode 511 is set to 0. Since the inversion threshold value was already exceeded, the state of the second neuron MOS inverter remains unchanged, and the ackout inversion signal also remains at a value of 1.

In the case in which the sendin signal then falls, with respect to the first neuron MOS inverter, the potential of the floating gate 503 becomes 0, and this is below the inversion threshold value, so that the sendout signal remains at 0. With respect to the second neuron MOS inverter, the potential of floating gate 511 is $V_{DD}/5$, since input electrode 513 is first set to a value of 0 as a result of the fall of the sendin signal, and this is less than the inversion threshold value, so that the second neuron MOS inverter resets and outputs a value of 1. The ackout inversion signal then acquires a value of 1. In concert with the resetting of the second neuron MOS inverter, the potential of input electrode 515 becomes 0, and the potential of floating gate 511 becomes 0; however, since the inversion threshold value was not previously exceeded, this state is maintained. After this, when the ackin inversion signal reaches a value of 1, this represents a return to the initial state.

The case will also be considered in which, after the rise in the sendout signal, the sendin signal falls prior to the fall of the ackin inversion signal. As a result of the fall of the sendin signal, the potential of the floating gate 503 of the first neuron MOS inverter becomes $5 V_{DD}/9$; however, since the inversion threshold value is exceeded, the sendout signal remains at a value of 1. However, with respect to the second neuron MOS inverter, the potential of the floating gate 511 is $2 V_{DD}/5$, and this drops below the inversion threshold value, and resetting is carried out from the inversion state. Accordingly, the output of the second neuron MOS inverter becomes 1, and the ackout inversion signal is reset to a value of 1.

Next, when the ackin inversion signal falls, the potential of the floating gate 503 of the first neuron MOS inverter becomes $3 V_{DD}/9$, and since this is below the threshold value, the first neuron MOS inverter is reset from the inversion state. The sendout signal falls to 0. The potential of the floating gate 503 of the second neuron MOS inverter becomes 0. When the ackin inversion signal then rises, this represents a return to the initial state.

Figure 11:
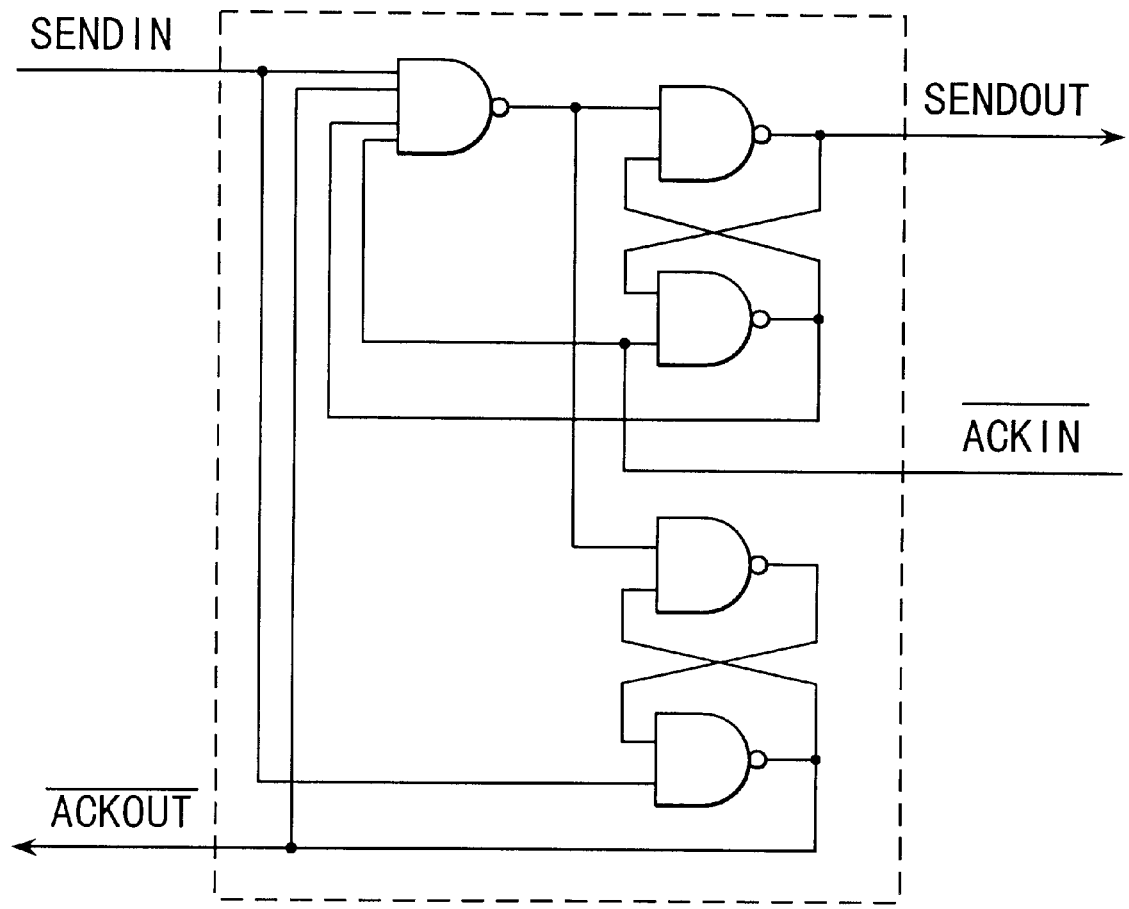
FIG. 11 is a C circuit diagram of an improved model.

The function described above is completely identical to that of the modified C circuit of FIG. 11. The number of required elements is such that 4 neuron MOS transistors are required, 6 standard MOS transistors, and 14 capacity elements are required (there is one of the elements having the smallest capacity, and the number of elements having 2 and 3 times this capacity are 2 and 3, respectively), for a total of 24 elements. The number of elements is identical to the circuit shown in FIG. 11; however, in this circuit, capacities are realized using a surface area which is considerably smaller than that when the standard MOS transistors are used. Accordingly, if the surface areas of the circuits are compared, the circuit of the present invention can be realized using a smaller surface area.

In the present embodiment, a neuron MOS inverter was used as the threshold element using neuron MOS; however, this need not be an inverter, and any circuit which outputs a value of 1 when a threshold value is exceeded, in the manner of a neuron element, may be employed. Furthermore, an inverter was used as the circuit through which the output of the threshold element using neuron MOS was connected to the input gate; however, other elements may be employed. Furthermore, an example was shown in which 2 memory circuits comprising neuron MOS inverters and standard inverters were connected to one another; however, this is not necessarily so limited, and for example, 3 or more memory circuits may be connected.

(Fifth Embodiment)

Figure 6:
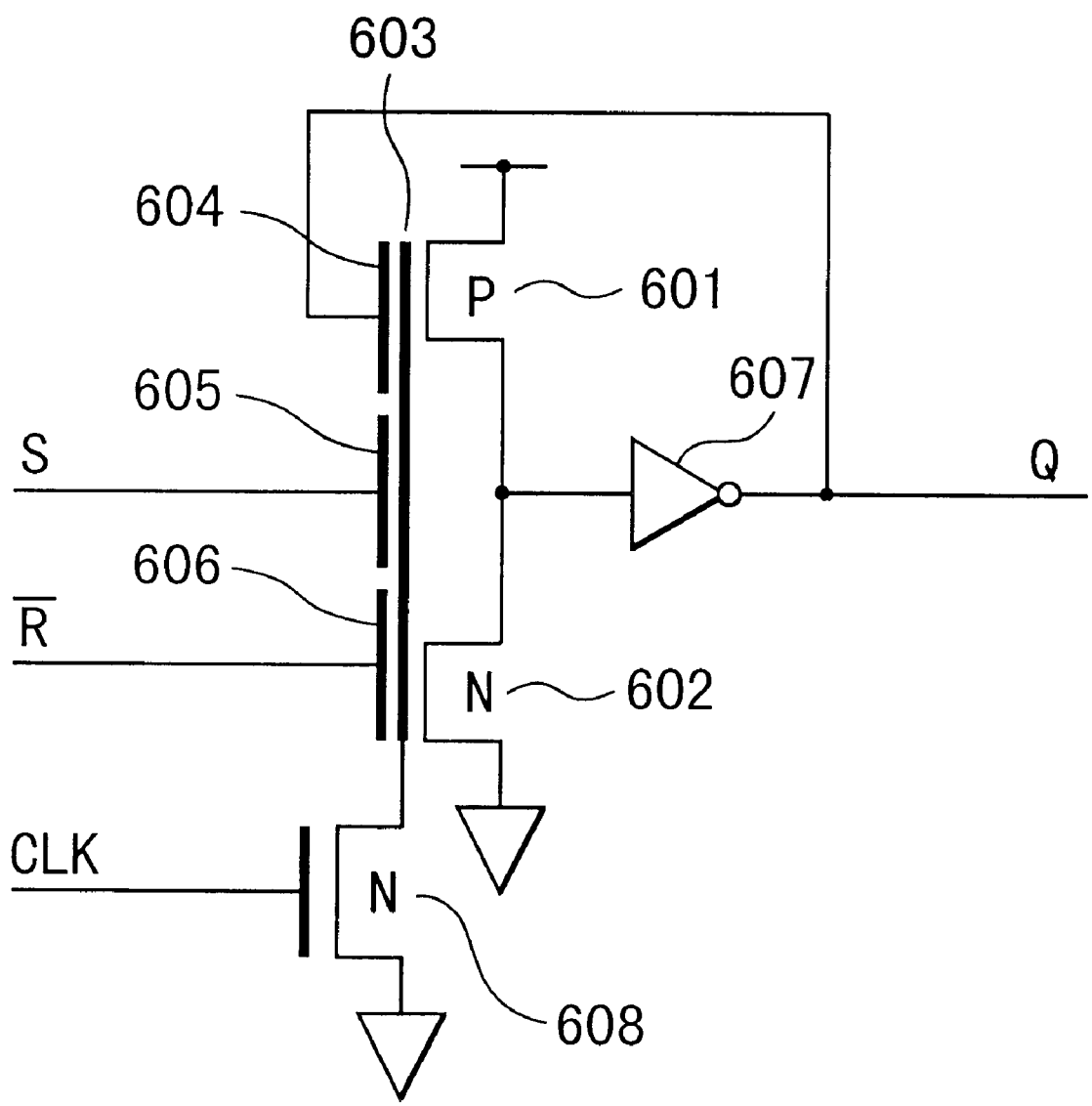
FIG. 6 is a circuit diagram showing a fifth embodiment.

FIG. 6 is a structural diagram of a circuit showing a fifth embodiment of the present invention. In the figure, reference 601 indicates a P type neuron MOS transistor, and reference 602 indicates a N type neuron MOS transistor; this forms a neuron MOS inverter. Reference 603 indicates a floating gate which is common to neuron MOS transistors 601 and 602. References 604, 605, and 606 indicate 3 input electrodes which are coupled with floating gate 603 and which have equal capacities. Reference 607 indicates a standard CMOS inverter. Reference 608 indicates a N type MOS transistor which controls the connection-disconnection of the floating gate 603 and the ground potential. The output of the neuron MOS inverter which is the threshold element is connected to the input electrode 604 of the neuron MOS inverter itself via inverter 607. The inputs of this circuit are the S signal connected to input electrode 605, and the R inversion signal connected to input electrode 606. The CLK signal which controls the N type MOS transistor 608 is used as a control signal. The output is the Q signal which is the output of inverter 607. Aside from the fact that a N type MOS transistor 608 is added, this circuit is identical to the circuit shown in FIG. 2. The N type MOS transistor 608 is provided in order to reset the surplus charge on the floating gate. By means of this, it is possible to reset the surplus floating gate charge generated by hot electron implantation and the like, and the accuracy and reliability are thus improved. The operation will now be explained. First, by setting the clock signal CLK to 1, the N type MOS transistor 608 enters an ON state, and the floating gate 603 is set to the ground potential (0V). At this time, the output of the neuron MOS inverter formed by P type neuron MOS transistor 601 and N type neuron MOS transistor 602 has a value of 1 ($V_{DD}$), and the output of inverter 607 has a value of 0, so that the potential of input electrode 604 also has a value of 0. Simultaneously, by setting the input S signal and the R inversion signal to a value of 0, the potentials of all of the input electrodes 604, 605, and 606 are set to 0. Accordingly, the difference in potential between the floating gate and the input electrodes is 0, and the charge on the floating gate is reset. After this, by setting the CLK signal to a value of 0, the N type MOS transistor 608 enters an OFF state, and the floating gate 603 is placed in an electrically floating state. In this state, the operation of the circuit is identical to that of the circuit shown in FIG. 2, so that a description thereof will be omitted here. In this manner, by providing a mechanism for temporarily connecting the floating gate 603 to a predetermined potential, the accuracy of the circuit is improved, and the reliability is also improve.

Figure 7:
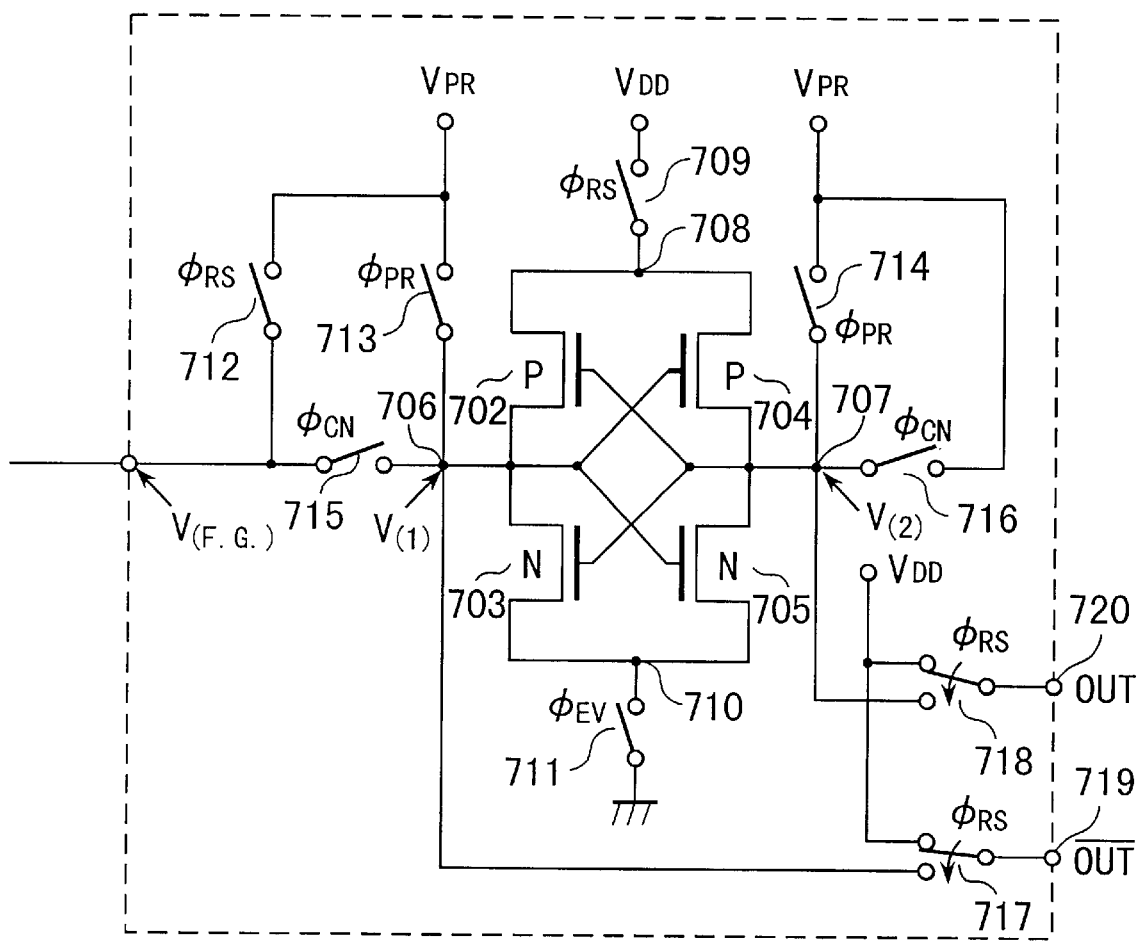
FIG. 7 is a circuit diagram showing a modified example of the threshold element.
Figure 8:
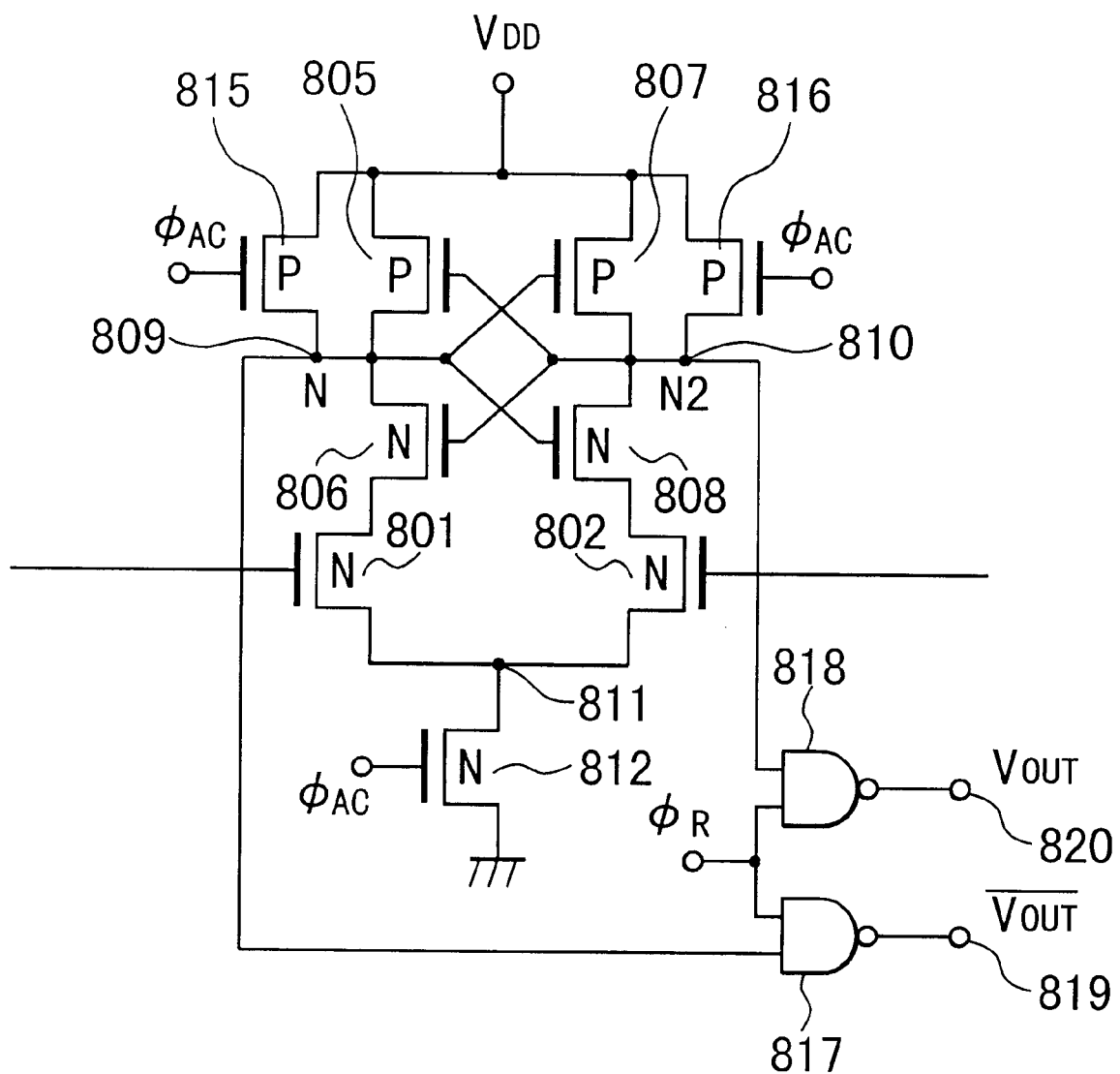
FIG. 8 is a circuit diagram showing another modified example of the threshold element.
Figure 9:
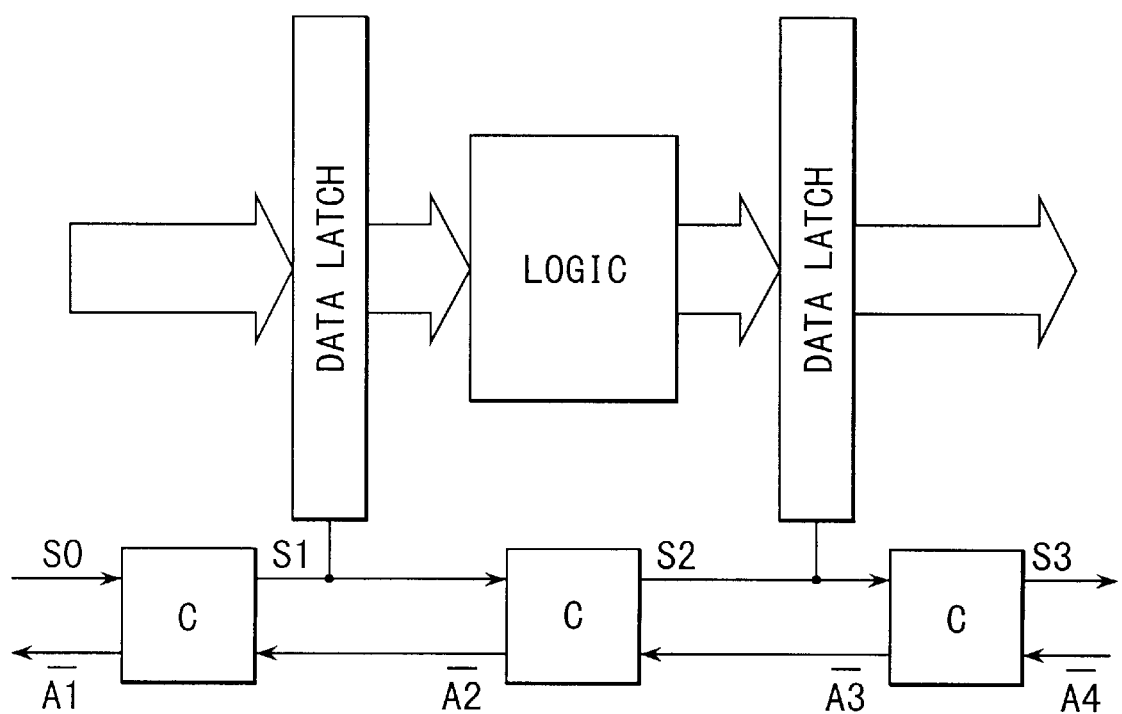
FIG. 9 is a schematic diagram of the self-timing mechanism.

In the fifth embodiment described above, a neuron MOS inverter was used as the threshold circuit; however, this need not be an inverter, and, for example, a circuit which outputs a value of 1 when a threshold value is exceeded, in the manner of a neuron element, may be employed, and furthermore, a latch type neuron MOS circuit having a steady power consumption such as that shown in FIGS. 7 and 8 (Japanese Patent Application No. 7-24441) may also be employed. A N type MOS transistor was employed as the switch element added to the floating gate; however, other elements may be employed in so far as they have a switching function. Furthermore, an example was shown in which the contact connected to the floating gate was a ground source; however, other contacts may be used, for example, the output contacts of the neuron MOS comprising 601 and 602. Furthermore, an inverter was used as the circuit through which the output of the threshold element using neuron MOS was connected to the input gate of the element itself; however, other elements may be employed. Furthermore, the output of the threshold element may be directly connected to the input gate.

EFFECTS OF THE INVENTION

In accordance with the invention as stated in claim 1, a multi-function circuit can be realized with a smaller number of elements.

In accordance with the invention as stated in claim 2, it is possible to realize a flip flop type circuit with a smaller number of elements.

In accordance with the invention as stated in claim 3, it is possible to realize a flip flop circuit such as a C circuit with a smaller number of elements, and it is thus possible to realize a self timing mechanism for high speed and ultra LSI.

In accordance with the invention as stated in claim 4, it is possible to realize a flip flop circuit such as a modified C circuit with a smaller number of elements, and it is thus possible to realize a self timing mechanism for ultra high speed and ultra LSI.

In accordance with the invention as stated in claim 5, the accuracy and reliability of the circuit are improved, and it thus possible to realize a highly reliable self timing circuit for ultra high speed ultra LSI.

What is claimed is:

1. A circuit assembly comprising a first feedback circuit comprising a first threshold circuit provided with an electronically floating electrode and a plurality of input electrodes connected with said floating electrode via capacity elements, having a mechanism for effectively determining the potential of said floating electrode by means of a potential applied to said input electrodes, the output of said first threshold circuit being determined by the potential of said floating electrode;

wherein the output of said first threshold circuit of said first feedback circuit is connected over a first feedback path to at least one of said plurality of input electrodes, either directly, or via at least one first circuit of some type and is connected over a second feedback path to at least one of a plurality of input electrodes of a second feedback circuit;

wherein said second feedback circuit comprising a second threshold circuit provided with an electrode which is electrically floating, and said plurality of input electrodes connected with said floating electrode via capacity elements, and which has a mechanism for effectively determining the potential of said floating electrode by means of potentials applied to said input electrodes, wherein the output of said second threshold circuit of said second feedback circuit is determined by the potential of said floating electrode, and the output of said second threshold circuit of said second feedback circuit is connected with at least one of said plurality of input electrodes of said second threshold circuit of said second feedback circuit, either directly, or via at least one second circuit of some type.

2. The circuit assembly in accordance with claim 1, wherein at least one of said first threshold circuit of said first feedback circuit and said second threshold circuit of said second feedback circuit respectively comprises an inverter having an input end coupled to the floating electrode.

3. The circuit assembly in accordance with one of claims 1 and 2, wherein at least one of said at least one first circuit of some type and said at least one second circuit of some type respectively comprises at least one inverter circuit.

4. The circuit assembly in accordance with one of claims 1 and 2, wherein at least one of said electronically floating electrode of said first feedback circuit and said electrically floating electrode of said second feedback circuit is respectively provided with a mechanism for temporary connection with a contact having a predetermined potential.

5. The circuit assembly in accordance with claim 3, wherein at least one of said electronically floating electrode of said first feedback circuit and said electrically floating electrode of said second feedback circuit is respectively provided with a mechanism for temporary connection with a contact having a predetermined potential.

* * * * *